United States Patent [19]

Sanemitsu

[11] Patent Number: 5,383,147
[45] Date of Patent: Jan. 17, 1995

[54] IC CARD AND METHOD OF CHECKING THE MEMORY CAPACITY OF IC CARD

[75] Inventor: Yoshikado Sanemitsu, Itami, Japan

[73] Assignee: Mitsubishi Denki Kabushiki Kaisha, Tokyo, Japan

[21] Appl. No.: 18,532

[22] Filed: Feb. 17, 1993

[30] Foreign Application Priority Data

Feb. 18, 1992 [JP] Japan .................... 4-030455

[51] Int. Cl.$^6$ .................... G11C 5/00; G11C 29/00
[52] U.S. Cl. .................... 365/52; 365/201; 365/189.01; 235/492
[58] Field of Search .................... 365/52, 96, 189.01, 365/201, 230.03; 235/492, 380

[56] References Cited

U.S. PATENT DOCUMENTS 4,419,747 12/1983 Jordan .................... 365/201
4,916,662 4/1990 Mizuta .................... 365/52
5,025,415 6/1991 Masuyama et al. .................... 365/52

Primary Examiner—Joseph A. Popek
Attorney, Agent, or Firm—Leydig, Voit & Mayer

[57] ABSTRACT

An IC card includes a plurality of memory ICs, each of the memory ICs having a data memory portion for storing data and an ID code memory portion in which are stored an ID code and a number of memory ICs mounted on the IC card; an address line and a data line connected to each of the plurality of memory ICs; and an address decoder for selecting one of the plurality of memory ICs according to an address signal on the address line. A method of checking the memory capacity of an IC card includes storing, in each of a plurality of memory ICs mounted on the IC card, an ID code of the memory IC and the number of memory ICs mounted on the IC card; reading out the ID code and the number of memory ICs mounted from any of said plurality of memory ICs; determining the capacity of the single memory IC from the read out ID code; and calculating the memory capacity of the entire IC card by multiplying the determined capacity of the memory IC by the number of the memory ICs mounted on the IC card.

3 Claims, 4 Drawing Sheets

IC CARD AND METHOD OF CHECKING THE MEMORY CAPACITY OF IC CARD

BACKGROUND OF THE INVENTION

1. Field of the Invention

The present invention relates to an IC card which enables its memory capacity to be checked, and a memory IC which is mounted on such an IC card.

2. Description of the Related Art

FIG. 4 shows the structure of a conventional IC card. A decoder 2 is connected to a connector 1 via a memory selection signal line 5 and a card enable signal line 6. The decoder 2 is also connected to a memory IC 3 for storing data via a chip enable signal line 7 and to a memory IC 4 for storing the capacity of the IC card via a chip enable signal line 8. Both the memory IC 3 for storing data and the capacity storing memory IC 4 are connected to the connector 1 via an address 9, a read-out control line 10, a write control line 11 and a data line 12. Data, such as the memory capacity of the IC card, is stored beforehand in the capacity storing memory IC 4.

When the IC card receives a card enable signal CE having a low level via the card enable signal line 6, it enters the operation enabled state, and the decoder 2 thereby outputs a chip enable signal selectively to either of the memory IC 3 for storing data and the capacity storing memory IC 4. Selection between the memory ICs 3 and 4 is made according to the level of a memory selection signal MS input via the memory selection signal line 5. For example, when memory selection signal MS is at the high level, the memory IC 3 is selected. When the memory selection signal MS is at the low level, the capacity storing memory IC 4 is selected. In both the memory ICs 3 and 4, the data stored in an address designated by the address line 9 is read out onto the data line 12 by lowering the read-out control line 10 to a low level and by raising the write control line 11 to a high level. The data on the data line 12 is written on an address designated by the address line 9 by raising the read-out control line 10 to a high level and by lowering the write control line 11 to a low level.

To check the memory capacity of the IC card, the card enable signal CE is lowered to a low level, the memory selection signal MS is lowered to a low level, the read-out control line 10 is lowered to a low level, the write control line 11 is raised to a high level and the address of the memory IC 4 for storing the memory capacity is designated by the address line 9, whereby the memory capacity is read out onto the data line 12.

Such a conventional IC card requires the memory capacity storing memory IC 4 in addition to the data storing memory IC 3, and thus has a complicated circuit structure.

SUMMARY OF THE INVENTION

Accordingly, an object of the present invention is to provide an IC card which has a simple circuit structure which enables the memory capacity to be checked.

Another object of the present invention is to provide a memory IC which is mounted on such an IC card.

Still another object of the present invention is to provide a method of checking the memory capacity of an IC card by a simple process.

In order to achieve the above objects, according to one aspect of the present invention, there is provided an IC card which comprises a plurality of memory ICs, each of the memory ICs having a data memory portion for storing data and an ID code memory portion with an ID code and the number of memory ICs mounted on the IC card stored in the memories, an address line and a data line connected to each of the plurality of memory ICs, and an address decoder for selecting one of the plurality of memory ICs according to an address signal on the address line.

According to another aspect of the present invention, there is provided a memory IC which comprises a data memory portion for storing data, an ID code memory portion for storing a manufacturer code, a device code and the number of memory ICs in the single IC card, an address line and a data line connected to both the data memory portion and the ID code memory portion, and selection means for selecting either of the data memory portion and the ID code memory portion according to an externally input mode setting command.

According to another aspect of the present invention, there is provided a method of checking memory capacity of an IC card which comprises the steps of storing, in each of a plurality of memory ICs mounted on the IC card, an ID code for the memory IC and the number of memory ICs mounted in the IC card, reading out the ID code and the number of memory ICs mounted from any of the plurality of memory ICs, determining the capacity of the single memory IC from the read out ID code, and calculating the memory capacity of the entire IC card by multiplying the determined capacity of the memory IC by the read out number of memory ICs mounted on the IC card.

DESCRIPTION OF THE PREFERRED EMBODIMENTS

Embodiments of the present invention will now be described with reference to the accompanying drawings.

Figure 1:
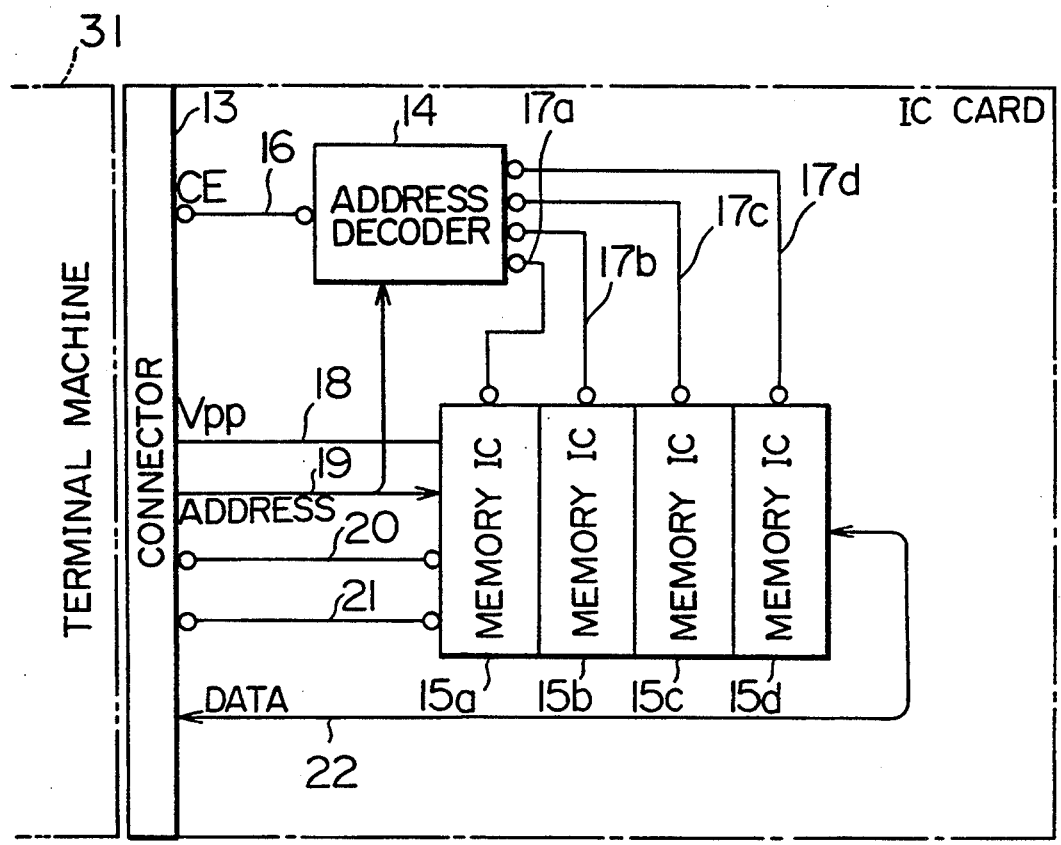
FIG. 1 is a block diagram of an IC card showing a first embodiment of the present invention.

An IC card according to a first embodiment of the present invention is shown in FIG. 1. In this IC card, an address decoder 14 is connected to a connector 13 via a card enable signal line 16. The address decoder 14 is also connected to memory ICs 15a through 15d via chip enable signal lines 17a through 17d, respectively. Each of the memory ICs 15a through 15d are connected to the connector 13 via a Vpp power line 18, an address line 19, a read-out control line 20, a write control line 21 and a data line 22. The upper 2 bits of the address line 19 are connected to the address decoder 14.

The above-described IC card is connected to a terminal machine 31 through the connector 13. When the IC card receives a card enable signal CE having a low level via the card enable signal line 16, it enters the operation enabled state, and the address decoder 14 thereby outputs a chip enable signal selectively to the one of the memory ICs 15a through 15d which is designated by the upper 2 bits of the address line 19. Thereafter, reading-out of data from the selected memory IC or writing of data into the selected memory IC is performed according to the level of the readout control line 20 and that of the write control line 21.

Figure 2:
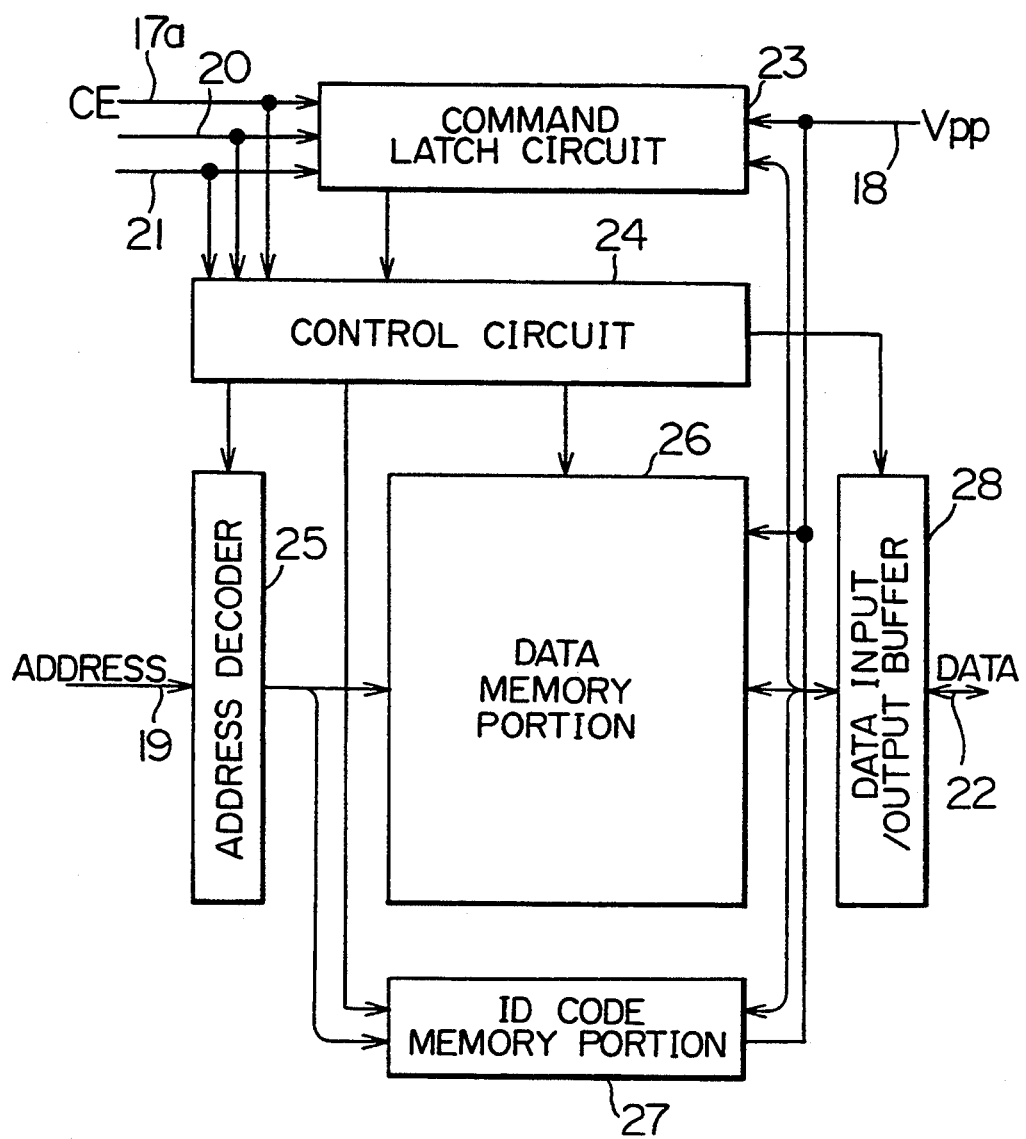
FIG. 2 is a block diagram of a memory IC employed in the first embodiment.

The memory ICs 15a through 15d have the same circuit configuration. Accordingly, the structure of only the memory IC 15a is shown in FIG. 2. A control circuit 24 is connected to a command latch circuit 23, and both a memory portion 26 for storing data and a memory portion 27 for storing ID codes are connected to the control circuit 24. The chip enable signal line 17a, the read-out control line 20 and the write control line 21 are connected to both the command latch circuit 23 and the control circuit 24. The address line 19 is connected to both the data memory portion 26 and the ID code memory portion 27 through an address decoder 25, and the data line 22 is connected to both the data memory portion 26 and the ID code memory portion 27 through a data input/output buffer 28. The Vpp power line 18 is connected to the command latch circuit 23, the data memory portion 26 and the ID code memory portion 27. The command latch circuit 23 and the control circuit 24 in combination form a selection means.

The data memory portion 26 stores various types of data processed during the operation of the IC card. The ID code memory portion 27 stores ID codes, such as a manufacturer code and a device code of the memory IC 15a, and the number of memory ICs 15a through 15d mounted on the IC card, which is 4 in this embodiment. These data items are stored in the ID code memory portion 27 before use of the IC card.

The operation of the memory IC 15a will be described below. First, when the Vpp power line 18 has a low voltage, e.g., 5 volts, the command latch circuit 23 is not operated, and the memory IC 15a thus operates as a data read-out only memory. Thus, the memory cell at the address designated by the address line 19 is selected by the address decoder 25 by the input of the chip enable signal CE having a low level to the control circuit 24 via the chip enable signal line 17a, and the data stored in that memory cell is read out onto the data line 22 through the data input/output buffer 28 by the lowering of the read-out control line and the raising of the write control line 21. It is to be noted that when the Vpp power line 18 is at a low voltage, the ID code memory portion 27 is not selected.

When the Vpp power line 18 is at a high voltage, e.g., 12 volts, the command latch circuit 23 is operated, and the mode setting command can thus be latched from the data line 22 through the data input/output buffer 28 by inputting the chip enable signal CE having a low level, by raising the read-out control line 20 and by lowering the write control line 21. The mode setting command is decoded by the control circuit 24, and one of the modes including the programming and erasing the data memory portion 26 and reading-out and writing of the ID code memory portion 27, is set according to the decoded mode setting command.

For example, when the chip enable signal CE is lowered, the read-out control line 20 is raised, the write control line 21 is lowered, and data 90h is input on the data line 22, data 90h is latched by the command latch circuit 23 through the data input/output buffer 28, and is decoded by the control circuit 24 as the reading-out mode of the ID code memory portion 27. Thus, the manufacturer code is read out from the ID code memory portion 27 selected by the control circuit 24 onto the data line 22 through the data input/output buffer 28 by lowering the chip enable signal CE, by lowering the read-out control line 20, raising the write control line 21 and by designating an address 00h on the address signal line 19. Similarly, a device code is read out onto the data line 22 from the ID code memory portion 27 by designating an address 01h on the address line 19. The number of memory ICs 15a through 15d mounted on the IC card, '4', is read out by designating an address 02h.

A table indicating the relationship between the manufacturer code, the device code and the memory capacity of various memory ICs is stored before use of the IC card in the terminal machine 31 coupled to the IC card through the connector 13. Therefore, the memory capacity m of the memory IC 15a is determined by reading out the manufacturer code and the device code from the memory IC 15a. In addition, the memory capacity M=4m of the entire IC card is calculated by multiplying the thus-obtained memory capacity m of the memory IC 15a by the number of memory ICs 15a through 15d mounted on the IC card, '4'.

In this embodiment, it is therefore possible to check the memory capacity of the entire IC card by a simple circuit configuration without providing a memory IC exclusively used to store the memory capacity.

Figure 3:
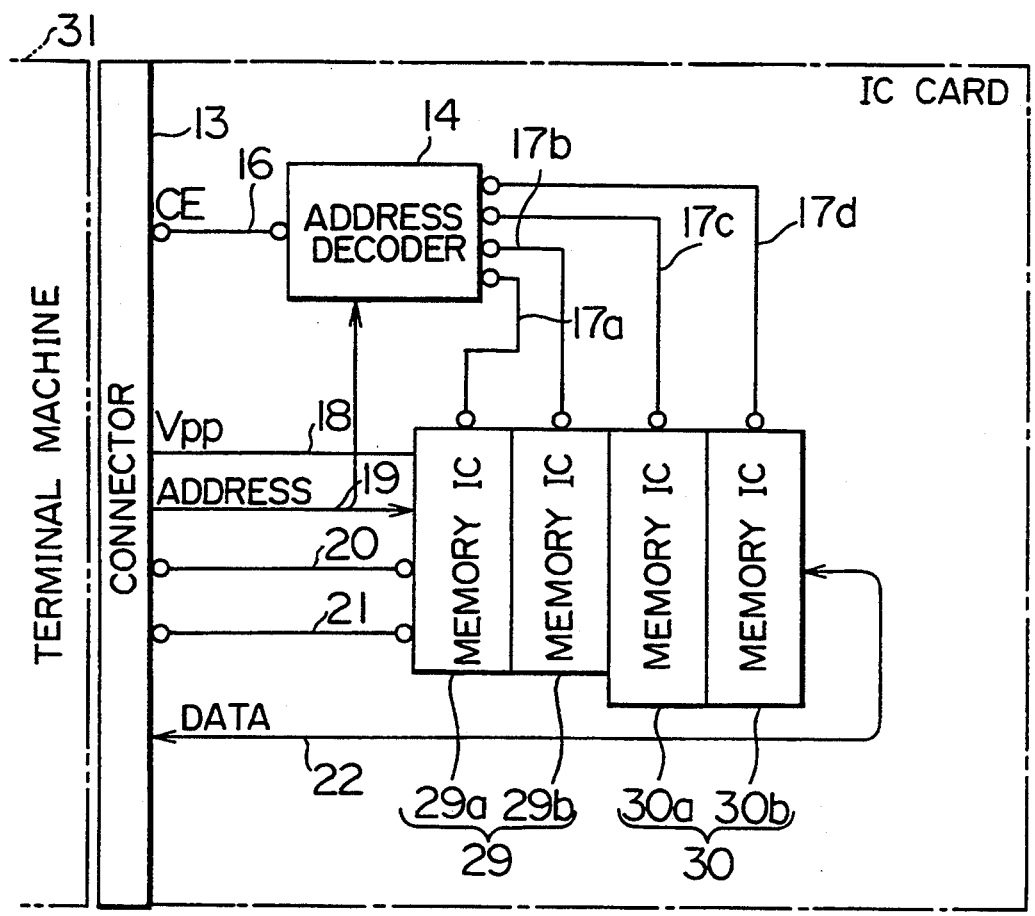
FIG. 3 is a block diagram of an IC card showing a second embodiment of the present invention.
Figure 4:
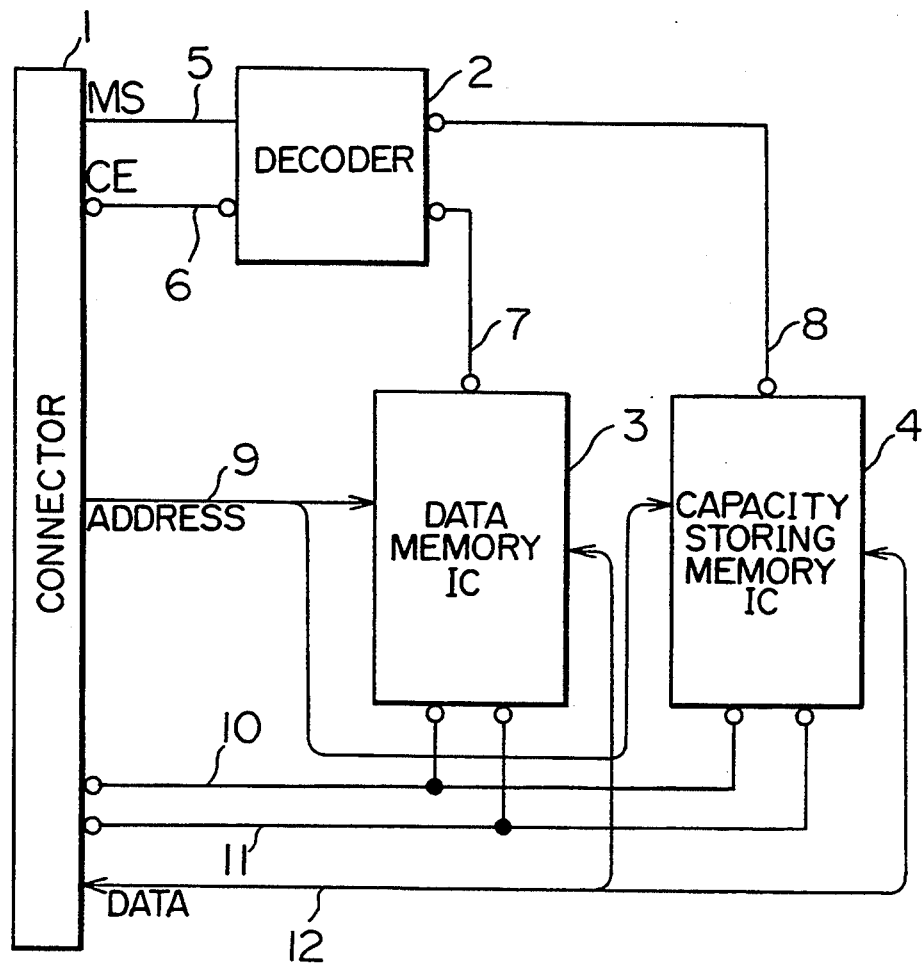
FIG. 4 is a block diagram of a conventional IC card.

FIG. 3 shows an IC card according to a second embodiment of the present invention. The IC card shown in FIG. 3 differs from the IC card shown in FIG. 1 in that it employs memory ICs 29a, 29b, 30a and 30b, while the IC card shown in FIG. 1 employs the memory ICs 15a through 15d. The memory ICs 29a, 29b, 30a and 30b have the same circuit configuration as that of the memory IC 15a shown in FIG. 2 with the exception that the memory ICs 29a and 29b are of the same type which has the same memory capacity m1 and form a first memory IC group 29 and that the memory ICs 30a and 30b have the same memory capacity m2, which is different from that of the memory ICs 29a and 29b, and form a second memory IC group 30. In the ID code memory portion of each of the memory ICs 29a and 29b, the ID code, such as the manufacturer code and the device code thereof, and the number of memory ICs mounted in the first memory IC group 29 to which the memory ICs 29a and 29b belong, which is '2' in this embodiment, are stored beforehand. Similarly, in the ID code memory portion of each of the memory ICs 30a and 30b, the ID code thereof as well as the number of memory ICs in the second memory IC group 30, which is '2' in this embodiment, are stored before use of the IC card.

The terminal machine 31 determines the memory capacity m1 of the memory IC 29a or 29b by reading out the ID code from either of the memory ICs 29a and 29b in the first memory IC group 29, and calculates the memory capacity M1=2m1 of the first memory IC group 29 by reading out the number of memory ICs 29 in the first memory IC group, which is '2' and then by multiplying the memory capacity m1 by '2'. Similarly, the terminal machine 31 calculates the memory capacity M2=2m2 of the second memory IC group Thereafter, the memory capacity M=M1+M2=2m1+2m2 of the entire IC card is calculated by adding the memory capacity M1 of the first memory IC group 29 to the memory capacity M2 of the second memory IC group 30.

In the memory IC 15a shown in FIG. 2, reading-out and writing of the ID code memory portion 27 are made possible by latching the mode setting command input via the data line 22 by means of the command latch circuit 23. However, reading-out and writing of the ID code may be performed by other methods. For example, it may be arranged such that reading-out and writing operations of the ID code memory portion 27 are performed when the control circuit 24 recognizes a high voltage applied to a single signal line.

What is claimed is:

1. An integrated circuit (IC) card comprising:
    an identical memory ICs each having a memory capacity m1 and p identical memory ICs each having a memory capacity m2, where n and p are each integers larger than one and m1 and m2 are different, each of said n memory ICs having a data memory portion for storing data and a code memory portion in which a code and the number n are stored, and each of said p memory ICs having a data memory portion for storing data and a code memory portion in which a code and the number p are stored;
    an address line and a data line connected to each of said memory ICs; and
    an address decoder for selecting one of said memory ICs according to an address signal on said address line.

2. A method of checking the memory capacity of an integrated circuit (IC) card, said method comprising the steps of:
    storing, in each of n identical memory ICs, each memory IC having an identical memory capacity and mounted on said IC card, where n is an integer greater than one, a code identifying the memory IC and the number n of memory ICs mounted on said IC card;
    reading out the code and the number n of memory ICs from any of said memory ICs;
    determining the memory capacity of the single memory IC from the read out code; and
    calculating the entire IC card memory capacity by multiplying the determined capacity of the memory IC by the number n of the memory ICs mounted on the IC card.

3. A method of checking the memory capacity of an integrated circuit (IC) card on which a plurality of memory IC groups, each memory group including the same type of memory IC, are mounted, said method comprising the steps of:
    storing, in each of the memory ICs, a code identifying the memory IC and the number of memory ICs in the memory IC group to which said memory IC belongs that are mounted on the IC card;
    reading out, from each of the memory IC groups, the code and the number of memory ICs in the memory IC group;
    determining the capacity of a memory IC in each of the memory IC groups from the read out code;
    calculating the memory capacity of each of the memory IC groups by multiplying the capacity of the memory IC in each of the memory IC groups by the read out number of memory ICs in the respective group; and
    calculating the memory capacity of the entire IC card by summing the memory capacities of each of the memory IC groups.

* * * * *